United States Patent [19]

Uchida et al.

[11] Patent Number: 5,248,527
[45] Date of Patent: Sep. 28, 1993

[54] PROCESS FOR ELECTROLESS PLATING TIN, LEAD OR TIN-LEAD ALLOY

[75] Inventors: Hiroki Uchida; Motonobu Kubo; Masayuki Kiso; Teruyuki Hotta; Tohru Kamitamari, all of Hirakata, Japan

[73] Assignee: C. Uyemura and Company, Limited, Osaka, Japan

[21] Appl. No.: 843,015

[22] Filed: Feb. 28, 1992

[30] Foreign Application Priority Data

Mar. 1, 1991 [JP] Japan ................................ 3-059642

[51] Int. Cl.$^5$ ............................................. C23C 2/00
[52] U.S. Cl. ................................ 427/437; 427/443.1; 427/304; 427/8
[58] Field of Search ............ 427/437, 443.1, 304, 427/305, 306, 8

[56] References Cited

U.S. PATENT DOCUMENTS

| Re. 30,434 | 11/1980 | Davis | 427/437 |
|---|---|---|---|
| 2,230,602 | 2/1941 | Sullivan | 427/437 |
| 4,093,466 | 6/1978 | Davis | 427/437 |
| 4,194,913 | 3/1980 | Davis | 427/437 |
| 5,143,544 | 9/1992 | Iantosca | 427/443.1 |

FOREIGN PATENT DOCUMENTS

| 57927 | 5/1975 | Japan | 427/304 |
|---|---|---|---|
| 112496 | 9/1981 | Japan | 427/304 |

OTHER PUBLICATIONS

A. H. Du Rose "The Protective Value of Lead and Lead-Tin Deposits on Steel" The Electrochemical Society Preprint 89-7 Apr., 1946, pp. 101-112.
Abstract 3-59642 of Japanese Patent Application Kokai No. 3-59642.
Abstract 1-184279 of Japanese Patent Application Kokai No. 1-184279.

*Primary Examiner*—Shrive Beck
*Assistant Examiner*—Vi Duong Dang
*Attorney, Agent, or Firm*—Birch, Stewart, Kolasch & Birch

[57] ABSTRACT

The invention provides a process for electroless plating tin, lead or tin-lead alloy on copper or copper alloy using an electroless plating bath containing a water soluble tin and/or lead salt, an acid capable of dissolving the salts, and a complexing agent. The tin and/or lead content in the bath is maintained high enough to chemically deposit thick films by replenishing the tin and/or lead salt in proportion to an increase in concentration of copper ion dissolving out in the bath. Also provided is an electroless tin, lead or tin-lead alloy plating process in which a water soluble copper salt is added to a fresh bath.

13 Claims, 2 Drawing Sheets

PROCESS FOR ELECTROLESS PLATING TIN, LEAD OR TIN-LEAD ALLOY

This invention relates to a process for electroless plating tin, lead or tin-lead alloy on copper or copper alloy.

BACKGROUND OF THE INVENTION

In the electronic industry, to impart solder receptivity to copper or copper alloy portions on electronic parts and circuits, it has been a common practice to form a tin, lead or tin-lead alloy coating on the copper or copper alloy portions by electroplating techniques. As electronic devices are reduced in size, parts and circuits are also miniaturized or complicated. Some finely defined portions are difficult to plate by electroplating techniques. Attention has been paid to electroless tin, lead or tin-lead plating techniques capable of plating on such finely defined portions. For example, Japanese Patent Application Kokai No. 184279/1989 proposes the use of an electroless tin-lead alloy plating bath predominantly containing a specific organic sulfonic acid, tin and lead salts thereof, sodium hypophosphite (reducing agent), and thiourea (complexing agent). However, most prior art electroless tin, lead or tin-lead alloy plating systems are designed as batchwise disposable systems in that metal replenishment is not contemplated, and the plating bath is discarded simply when the metal concentration falls below the deposition limit. Such systems are employed mainly when it is desired to form thin plating films. Few proposals have been made for the continuous operation of an electroless plating bath for the purpose of establishing thick plating films. No study has been made of the controlled replenishment of an electroless plating bath able to maintain the constant rate of deposition which is essential for continuous operation.

In ordinary electroless plating processes, the plating baths are managed by analyzing the bath for metal components, and replenishing necessary metal components to the bath in proportion to their consumption. We found that it is difficult to simply and accurately analyze tin and lead components in an electroless tin, lead or tin-lead alloy plating bath for the plating of copper-containing articles, because with the progress of plating, copper is dissolved out of the articles and gradually accumulated in the bath. Therefore, the conventional electroless plating bath management is hardly applicable to the electroless tin, lead or tin-lead alloy plating bath.

Therefore, there is a need for an electroless tin, lead or tin-lead alloy plating process capable of controlling the content of tin, or lead in an electroless tin lead or tin-lead alloy plating bath in a simple, but consistent manner, thereby facilitating continuous plating of thick films.

The current mount technology of electronic parts like integrated circuit packages is undergoing a transition from the vertical mount technology (VMT) of DIP type packages to the surface mount technology (SMT) of flat packages. Accordingly, printed circuit boards are desired to present a smooth surface in contact with IC packages and other parts to be mounted, that is, to have a highly uniform tin, lead or tin-lead alloy plating film on copper or copper alloy circuit conductors.

The conventional electroless tin, lead or tin-lead alloy plating baths, however, are less stable at the initation of operations, and tend to deposit films of coarse grains, which are poor in uniformity of film thickness and alloy composition. That is, the conventional electroless plating baths are likely to produce tin, lead or tin-lead alloy films which are defective in outer appearance or reflow at the initial stage and resultin find difficulty in the plating of small-size parts such as SMT-oriented fine pitch printed circuit boards and chip parts.

Therefore, there is a need for an electroless tin, lead or tin-lead alloy plating process capable of producing a uniform plating film throughout the service life of a plating bath from the initial formulation to the end of long-term operation and capable of accommodating SMT-oriented fine pitch printed circuit boards and chip parts.

SUMMARY OF THE INVENTION

A primary object of the present invention is to provide an electroless tin, lead or tin-lead alloy plating process which ensures that the content of tin or lead in an electroless tin, lead or tin-lead alloy plating bath is controlled in a simple, consistent manner, thereby facilitating continuous plating of thick films.

Another object of the present invention is to provide an electroless tin, lead or tin-lead alloy plating process which can deposit a uniform film throughout the service life of a plating bath from the initial formulation to the end of long-term operation, accommodating for SMT-oriented fine pitch printed circuit boards and chip parts.

Investigating a process for the electroless plating tin, lead or tin-lead alloy on copper or copper alloy using an electroless plating of bath containing a water soluble tin salt and/or a water soluble lead salt, an acid capable of dissolving the salts, and a complexing agent, we have found that this plating mechanism is characterized in that copper is dissolved into the bath from the copper or copper alloy which constitutes an article to be plated and at the same time, tin, lead or tin-lead alloy is deposited on the article to form a coating thereon. Namely, copper builds up in the plating bath with the progress of plating. The amount of copper ion dissolved into the plating bath is in proportion to the amount of tin and/or lead consumed, and the concentration of copper ion dissolved in the plating bath can be readily and accurately analyzed. Then, by analyzing the concentration of copper ion dissolved in the plating bath and replenishing a tin salt and/or lead salt in proportion to an increase of the copper ion concentration, the content of tin or lead in the electroless tin, lead or tin-lead alloy plating bath is controllable in a simple and consistent manner. The present invention is predicated on this finding.

Therefore, a first form of the present invention provides a process for chemical or electroless plating tin, lead or tin-lead alloy on copper or copper alloy using an electroless plating bath comprising a water soluble tin salt and/or a water soluble lead salt, an acid capable of dissolving the slats, and a complexing agent, characterized in that the water soluble tin salt and/or water soluble lead salt is replenished in proportion to an increase in concentration of copper ion dissolving out in the plating bath.

Further investigating the composition of an electroless tin, lead or tin-lead alloy plating bath containing a water soluble tin salt and/or a water soluble lead salt, an acid capable of dissolving the salts, and a complexing agent, we have also found that by previously adding a water soluble copper salt to the fresh or make-up plating bath, there is obtained an electroless tin, lead or tin-lead alloy plating bath which remains highly stable throughout its service life from the initial formulation to the end of long-term operation. Tin, lead or tin-lead alloy deposits resulting from this fresh bath consist essentially of uniform fine grains and exhibit good reflow from the start, and are thus fully applicable to SMT-oriented fine pitch printed circuit boards.

Therefore, a second form of the present invention provides a process for chemical or electroless plating of tin, lead or tin-lead alloy comprising adding a water soluble copper salt to a fresh or make-up electroless plating bath comprising a water soluble tin salt and/or a water soluble lead salt, an acid capable of dissolving the salts, and a complexing agent, and electroless plating tin, lead, or tin-lead alloy on copper or copper alloy using said bath.

DESCRIPTION OF THE PREFERRED EMBODIMENTS

Figure 1:
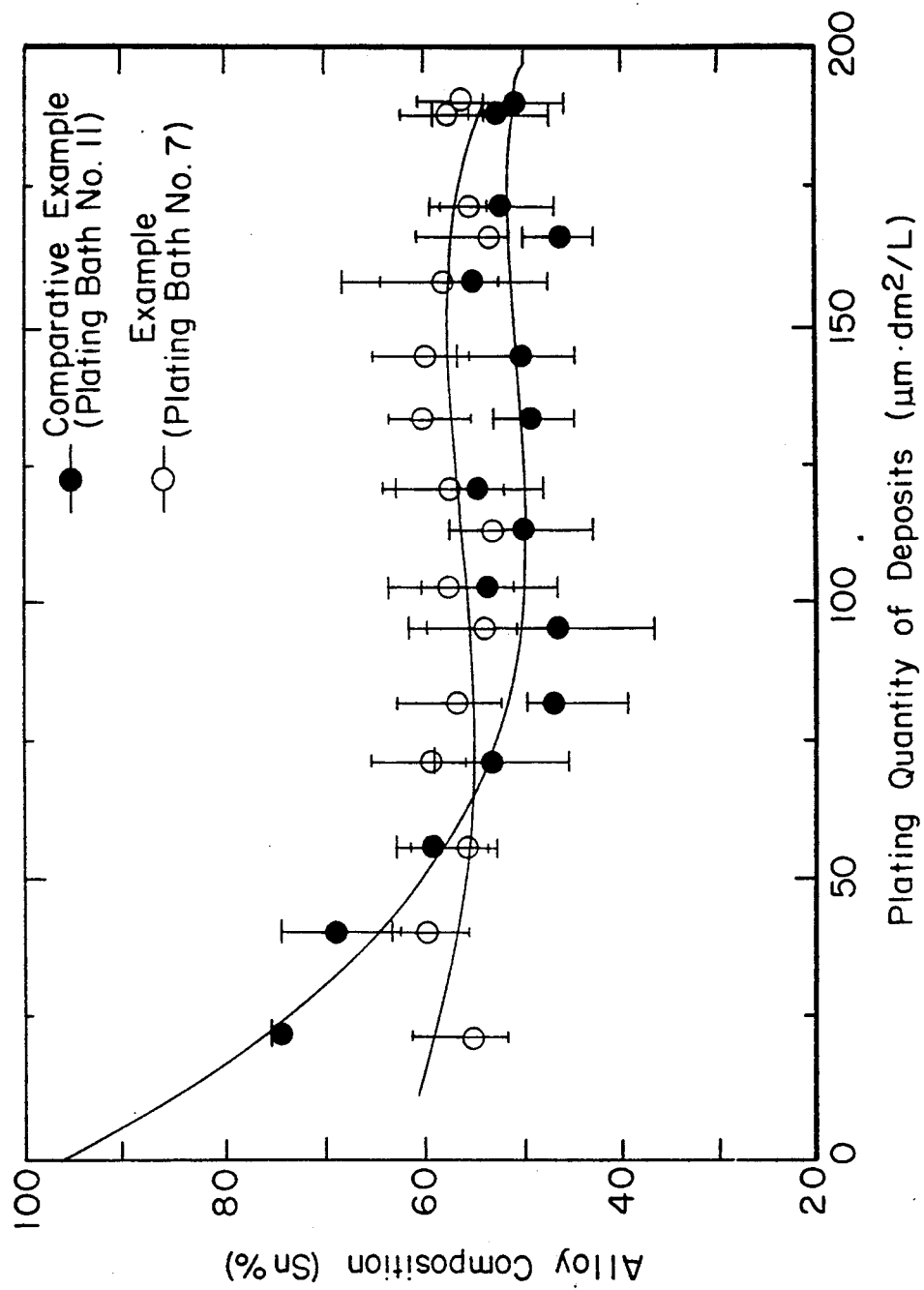
FIG. 1 is a graph illustrating the alloy composition relative to plating quantity of deposits when tin-lead alloy is deposited using plating bath No. 7 (Example) and No. 11 (Comparative Example).

In either of the first and second forms of the present invention, the chemical or electroless plating bath used contains as main ingredients (A) a metal salt component selected from the group consisting of a water soluble tin salt, a water soluble lead salt and a mixture thereof, (B) an acid component capable of dissolving the metal salt component, and (C) a complexing agent.

For metal salt component (A), any water soluble tin salt may be used which can provide a stannous ion, i.e., divalent tin ion. Included are stannous oxide, stannous chloride, stannous sulfate, stannous organic sulfonates such as stannous alkane sulfonates and stannous alkanol sulfonates, stannous organic carboxylates, stannous sulfosuccinate, and stannous borofluoride. Examples of the water soluble lead salt include lead chloride, lead sulfate, lead acetate, lead oxide, lead organic sulfonates such as lead methanesulfonate and lead alkanol sulfonates, and lead borofluoride. The metal salt components are preferably contained in amounts of about 0.5 to 30 grams/liter, especially about 1 to 20 grams/liter.

Acid component (B) capable of dissolving these metal salts includes organic sulfonic acids, perchloric acid, fluoroboric acid, phosphoric acid, pyrophosphoric acid, condensed phosphoric acids such as polyphosphoric acids, and hydrochloric acid and a mixture of two or more of these acids. Exemplary of the organic sulfonic acids are alkane sulfonic acids, hydroxyalkane sulfonic acids, benzene sulfonic acid, naphthalene sulfonic acid and substituted ones thereof in which one or more hydrogen atoms are replaced by halogen atoms, hydroxyl, alkyl, carboxyl, nitro, mercapto, amino, and sulfonate groups. More specifically, preferred examples of the organic sulfonic acid used herein include methanesulfonic acid, ethanesulfonic acid, propanesulfonic acid, 2-propanesulfonic acid, butanesulfonic acid, 2-butanesulfonic acid, pentanesulfonic acid, hexanesulfonic acid, decanesulfonic acid, dodecanesulfonic acid, chloropropanesulfonic acid, 2-hydroxyethane-1-sulfonic acid, 2-hydroxypropane-1-sulfonic acid, 1-hydroxypropane-2-sulfonic acid, 3-hydroxypropane-1-sulfonic acid, 2-hydroxybutane-1-sulfonic acid, 4-hydroxybutane-1-sulfonic acid, 2-hydroxypentane-1-sulfonic acid, 2-hydroxyhexane-1-sulfonic acid, 2-hydroxydecane-1-sulfonic acid, 2-hydroxydodecane-1-sulfonic acid, allysufonic acid, 2-sulfoacetic acid, 2- or 3-sulfopropionic acid, sulfosuccinic acid, sulfomaleic acid, sulfofumaric acid, benzenesulfonic acid, toluenesulfonic acid, xylenesulfonic acid, nitrobenzenesulfonic acid, sulfobenzoic acid, sulfosalicylic acid, benzaldehydesulfonic acid, p-phenolsulfonic acid, etc. The acids are preferably used in amounts of about 50 to 250 grams/liter, especially about 100 to 200 grams/liter. The metal salt can precipitate if the contents of the acid component is too low, whereas too high contents of the acid component would lower the deposition rate.

Complexing agent (C) includes, for example, oxalic acid, tartaric acid, citric acid, ethylenediaminetetraacetic acid (EDTA) and salts thereof, thiourea, thiourea derivatives, triethanol amine, and a mixture thereof. The complexing agents are preferably used in amounts of about 30 to 200 grams/liter, especially about 50 to 150 grams/liter. Too low contents of the complexing agent would allow the bath to decompose, whereas too high contents of the complexing agent would lower the deposition rate. Preferred among the above-mentioned complexing agents are thiourea and its derivatives, which are preferably used in amounts of about 50 to 200 grams/liter, especially about 50 to 150 grams/liter. Exemplary of the thiourea derivatives are thioamides such as thioformamide, thioacetamide, etc.

A reducing agent may be added to the plating bath. Preferred examples of the reducing agent include hypophosphorous acid, and water soluble hypophosphites such as sodium, hypophosphite and potassium hypophosphite. The reducing agents are added in commonly used amounts, preferably from about 30 to 300 grams/liter, more preferably from about 50 to 200 grams/liter.

In addition, any other conventional additive may be added in commonly used amounts. The plating bath is preferably adjusted to pH 0 to 3 and maintained at temperatures of about 60° to 90° C. during the plating operation.

The plating process according to the first form of the present invention is by dipping an article to be plated, at least a portion of which is formed of copper or copper alloy, in the above-defined plating bath, thereby depositing a coating of tin, lead or tin-lead alloy on the copper or copper alloy portion of the article. The copper alloy should contain more than 50% by weight of copper and include Cu-Zn, Cu-Sn, etc. During the process, copper ion is dissolved from the article into the plating bath simultaneously with deposition of tin, lead or tin-lead alloy. The concentration of copper ion dissolved out is analyzed at suitable intervals. When the concentration of copper ion reaches a predetermined level, that is, increases by a predetermined value, the tin or lead salt is replenished to the bath in an amount corresponding to the copper ion increase. Replenishment may be made by adding the tin or lead salt directly or a solution of the salt in water or a plating solution containing the salt. One approach is to simply make up the tin or lead salt as the copper concentration increases. Alternatively, when the copper concentration increases by a predetermined quantity, a certain amount of the used plating solution is discarded and a corresponding amount of a fresh plating solution is made up so as to provide the necessary replenishment of tin or lead salt.

The plating process in the replenishment mode as mentioned above allows the plating bath to survive until copper ion builds up to a concentration of about 8 to 10 grams/liter, which corresponds to a total plating quantity of about 300 μm.dm²/liter.

Quantitative determination of the copper ion concentration can be done by atomic absorption spectroscopy.

By simply analyzing the concentration of copper ion dissolving into a plating bath, the plating process according to the first form of the invention permits the plating bath to be controlled in such a manner that a tin, lead or tin-lead alloy coating can be continuously formed to a substantial thickness. This plating process is advantageously employed to form tin, lead or tin-lead alloy coatings on copper or copper alloy portions of electronic parts or circuits for imparting solder receptivity thereto.

The second form of the present invention is also directed to an electroless tin, lead or tin-lead alloy plating process. In formulating a bath containing (A) a metal salt component selected from the group consisting of a water soluble tin salt, a water soluble lead salt, and a mixture thereof, (B) an acid capable of dissolving the salts, (C) a complexing agent preferably in the form of thiourea or a derivative thereof, and an optional reducing agent, there is added a water soluble copper salt to a fresh electroless plating bath. The plating process of the second form have the advantage that the bath is stable and the deposited coating is uniform due to the copper salt added to the bath.

Components (A) to (C) and reducing agent are as previously mentioned. The water soluble copper salts used herein include copper sulfate, cuprous chloride, cupric chloride, copper borofluoride, cuprous oxide, cupric oxide, copper acetate, copper organic sulfonates, and copper organic carboxylates. The copper salts are preferably added to the fresh or make-up bath in amounts of about 0.01 to 5 grams/liter, more preferably about 0.1 to 3 grams/liter.

In carrying out chemical or electroless plating using the bath of the second form, the process of the first form may be combined. That is, electroless plating in the bath of the second form may be carried out while analyzing the copper ion in the bath and replenishing a water soluble tin and/or lead salt in proportion to an increase of the copper ion concentration.

The fresh electroless tin, lead or tin-lead alloy plating bath containing the water soluble copper salt remains stable throughout its service life from the initial formulation to the end of long-term operation and thus always deposits a uniform tin, lead or tin-lead alloy film from the start which can accommodate for SMT-oriented fine pitch printed circuit boards and chip parts.

The electroless plating processes of the first and second forms of the invention are advantageously employed in electroless plating on copper or copper alloy portions of electronic parts, typically printed circuit boards for providing solderability thereto, but are equally applicable to electroless plating on other copper and copper alloy bearing articles.

EXAMPLE

Examples of the present invention are given below by way of illustration and not by way of limitation.

EXAMPLE 1

Copper parts were successively dipped in an electroless tin-lead alloy plating bath of the following composition where chemical tin-lead alloy plating was performed at a bath temperature of 80° C. During plating, the copper ion concentration was analyzed at intervals by atomic absorption spectroscopy. Whenever the concentration increased by 0.5 grams/liter, the following replenishers (1) to (3) were supplied to the bath in the indicated rates. The deposition rate was 13 μm/15 min. and remained constant until 8 grams/liter of copper built up in the bath. The total plating quantity was 260 μm.dm²/liter.

| Bath composition | |
|---|---|
| Methanesulfonic acid | 50 g/l |
| Tin methanesulfonate | 20 g/l |
| Lead methanesulfonate | 13 g/l |
| Thiourea | 75 g/l |
| Sodium hypophosphite | 80 g/l |
| Citric acid | 15 g/l |
| Surface active agent | 5 g/l |
| EDTA | 3 g/l |
| pH | 2.0 |
| Replenisher (1): 5 ml/liter | |
| Tin methanesulfonate | 400 g/l |
| Methanesulfonic acid | 180 g/l |
| Replenisher (2): 5 ml/liter | |
| Lead methanesulfonate | 380 g/l |
| Methanesulfonic acid | 240 g/l |
| Replenisher (3): 15 ml/liter | |
| Thiourea | 120 g/l |
| Sodium hypophosphite | 3 g/l |
| Citric acid | 25 g/l |

EXAMPLE 2

There was prepared a plating bath of the composition shown below, to which cuprous methanesulfonate was added to provide a copper ion concentration of 4.5 grams/liter. Copper parts were successively dipped in the bath where electroless plating was performed at a bath temperature of 80° C. while copper ion concentration was controlled in the range between 4.5 grams/liter and 5.0 grams/liter. Whenever the copper ion concentration increased by 0.5 grams/liter, that is, the concentration reached the upper limit of 5.0 grams/liter, a 1/10 volume of the bath was discharged and the same volume of the following replenisher was supplied to the bath to maintain the copper ion concentration in the control range. The deposition rate was 13 μm/15 min. and remained substantially constant during 20 replenishments. The copper concentration in the bath was measured by atomic absorption spectroscopy.

| Bath composition | |
|---|---|
| Methanesulfonic acid | 50 g/l |
| Tin methanesulfonate | 20 g/l |
| Lead methanesulfonate | 13 g/l |
| Cuprous methanesulfonate | 4.5 g/l of Cu |
| Thiourea | 75 g/l |
| Sodium hypophosphite | 80 g/l |
| Citric acid | 15 g/l |
| Surface active agent | 5 g/l |
| EDTA | 3 g/l |
| pH | 2.0 |
| Temperature | 80° C. |
| Replenisher | |
| Methanesulfonic acid | 50 g/l |

| -continued | |
|---|---|
| Tin methanesulfonate | 22 g/l |
| Lead methanesulfonate | 15 g/l |
| Thiourea | 83 g/l |
| Sodium hypophosphite | 80 g/l |
| Citric acid | 15 g/l |
| Surface active agent | 5 g/l |
| EDTA | 3 g/l |
| pH | 2.0 |

EXAMPLES 3 TO 9 AND COMPARATIVE EXAMPLES 1 TO 3

Printed circuit board test pieces having a copper circuit formed thereon were dipped in plating baths of the following composition Nos. 3 to 9 (Examples within the scope of the invention) and Nos. 10 to 12 (Comparative Examples not containing copper ions before plating). At a bath temperature of 80° C., tin or tin-lead alloy layers were deposited on the copper circuits of the test pieces. This operation was repeated several cycles and the thickness and composition of the resulting deposits were examined at the end of each cycle.

| Bath composition No. 3 | |
|---|---|
| Methanesulfonic acid | 30 g/l |
| Stannous methanesulfonate | 20 g/l |
| Lead methanesulfonate | 13 g/l |
| Thiourea | 75 g/l |
| Sodium hypophsophite | 80 g/l |
| Citric acid | 15 g/l |
| EDTA | 3 g/l |
| Copper sulfate | 0.5 g/l |
| pH | 2.0 |
| Bath composition No. 4 | |
| Methanesulfonic acid | 50 g/l |
| Stannous methanesulfonate | 20 g/l |
| Lead methanesulfonate | 13 g/l |
| Thiourea | 75 g/l |
| Sodium hypophosphite | 80 g/l |
| Citric acid | 15 g/l |
| EDTA | 3 g/l |
| Copper methanesulfonate | 3 g/l |
| pH | 2.5 |
| Bath composition No. 5 | |
| Fluoroboric acid | 20 g/l |
| Stannous borofluoride | 20 g/l |
| Lead borofluoride | 50 g/l |
| Thiourea | 80 g/l |
| Pyrophosphoric acid | 200 g/l |
| Sodium hypophosphite | 50 g/l |
| Copper borofluoride | 5 g/l |
| pH | 0.8 |
| Bath composition No. 6 | |
| Stannous borofluoride | 20 g/l |
| Lead borofluoride | 50 g/l |
| Fluoroboric acid | 60 g/l |
| Thiourea | 80 g/l |
| Hypophosphorous acid | 50 g/l |
| Cuprous chloride | 1 g/l |
| pH | 1.8 |
| Bath composition No. 7 | |
| Stannous borofluoride | 20 g/l |
| Lead borofluoride | 10 g/l |
| Fluoroboric acid | 200 g/l |
| Thiourea | 50 g/l |
| Hypophosphorous acid | 150 g/l |
| Cuprous oxide | 2 g/l |
| pH | 1.8 |
| Bath composition No. 8 | |
| Stannous borofluoride | 50 g/l |
| Flouroboric acid | 200 g/l |
| Thiourea | 50 g/l |
| Sodium hypophosphite | 30 g/l |
| Cupric chloride | 0.1 g/l |
| pH | 0.8 |

| -continued | |
|---|---|
| Bath composition No. 9 | |
| Stannous methanesulfonate | 20 g/l |
| Thiourea | 120 g/l |
| Sodium hypophosphite | 80 g/l |
| Hypophosphorous acid | 40 g/l |
| Copper acetate | 0.5 g/l |
| pH | 1.1 |
| Bath composition No. 10 | |
| Methanesulfonic acid | 70 g/l |
| Stannous methanesulfonate | 20 g/l |
| Lead methanesulfonate | 13 g/l |
| Thiourea | 75 g/l |
| Sodium hypophosphite | 80 g/l |
| Citric acid | 15 g/l |
| EDTA | 3 g/l |
| pH | 2.0 |
| Bath composition No. 11 | |
| Fluoroboric acid | 200 g/l |
| Stannous borofluoride | 20 g/l |
| Lead borofluoride | 10 g/l |
| Thiourea | 50 g/l |
| Hypophosphorous acid | 150 g/l |
| Sodium hypophosphite | 30 g/l |
| pH | 0.9 |
| Bath composition No. 12 | |
| Fluoroboric acid | 20 g/l |
| Sodium fluoroborate | 10 g/l |
| Stannous borofluoride | 20 g/l |
| Lead borofluoride | 50 g/l |
| Thiourea | 80 g/l |
| Sodium hypophosphite | 50 g/l |
| pH | 0.9 |

Figure 2:
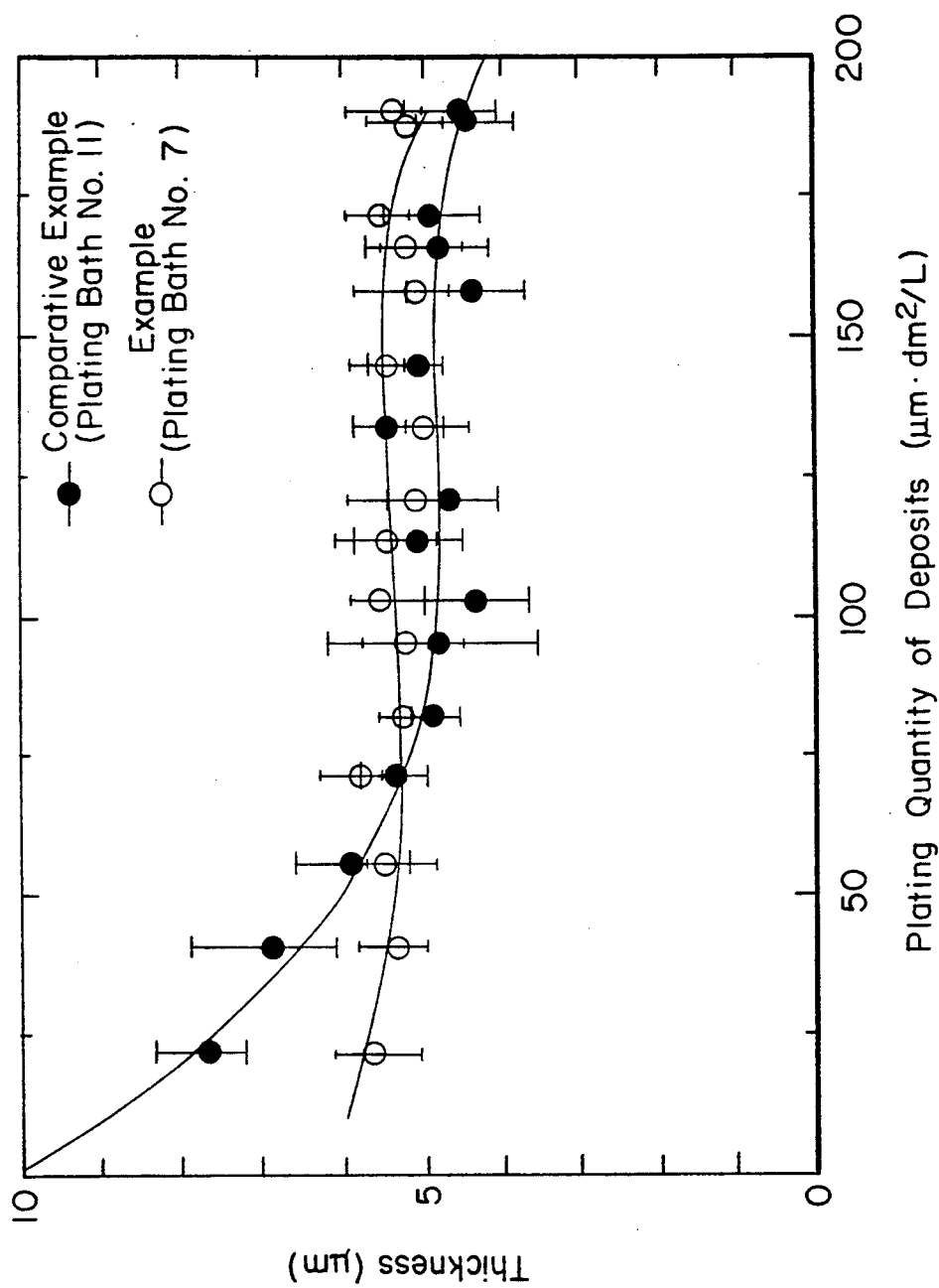
FIG. 2 is a graph illustrating the thickness relative to plating quantity of deposits when tin-lead alloy is deposited using plating bath No. 7 (Example) and No. 11 (Comparative Example).

The thickness and composition of the deposit resulting from each bath were examined to find that the deposits resulting from plating bath Nos. 3 to 9 were more uniform in thickness and composition from immediately after preparation to the end of long-term service than those from plating bath Nos. 10 to 12. With respect to the deposits resulting from bath No. 7 (Example) and bath No. 11 (Comparative Example), FIG. 1 shows the alloy composition of deposits relative to plating quantity and FIG. 2 shows the thickness of deposits relative to plating quantity.

There has been described an electroless tin, lead or tin-lead alloy plating bath which remains stable throughout its service life from its preparation to the end of long-term operation and thus always deposits films of uniform thickness and alloy composition, accommodating the fine pitch SMT.

While the invention has been described in what is presently considered to be a preferred embodiment, other variations and modifications will become apparent to those skilled in the art. It is intended, therefore, that the invention not be limited to the illustrative embodiments, but be interpreted within the full spirit and scope of the appended claims.

I claim:

1. A process for electroless plating tin, lead, or tin-lead alloy comprising the steps of:
   (a) electroless plating tin, lead, or tin-lead alloy on copper or copper alloy using an electroless plating bath comprising a water soluble tin salt, a water soluble lead salt, or a combination thereof, an acid capable of dissolving the salts, and complexing agent;
   (b) analyzing the concentration of copper ion dissolving out in the plating bath during said electroless plating; and
   (c) replenishing said water soluble tin salt, water soluble lead salt, or combination thereof in proportion to an increase in said concentration of copper ion dissolving out in the plating bath.

2. The process of claim 1 where said water soluble tin salt, said water soluble lead salt or both are contained in an amount of about 0.5 to 30 grams/liter, said acid is contained in an amount of about 50 to 200 grams/liter and said complexing agent is contained in an amount of about 50 to 200 grams/liter.

3. The process of claim 1 wherein said complexing agent is thiourea or a derivative thereof.

4. The process of claim 1 wherein the electroless plating bath further comprises a reducing agent.

5. The process of claim 4 wherein said reducing agent is hypophosphorus acid or a water soluble hypophosphite.

6. The process of claim 4 wherein said reducing agent is contained in an amount of about 30 to 300 grams/liter.

7. A process for electroless plating tin lead, or tin-lead alloy comprising the steps of:
(a) adding a water soluble copper salt to a fresh electroless plating bath comprising a water soluble tin salt, a water soluble lead salt, or a combination thereof, an acid capable of dissolving the salts, and a complexing agent;
(b) electroless plating tin, lead, or tin-lead alloy on copper alloy using said plating bath;
(c) analyzing the concentration of copper ion dissolving out in the plating bath during said electroless plating; and
(d) replenishing said water soluble tin salt, water soluble lead salt, or combination thereof in proportion to the increase in concentration of copper ion dissolving out in the plating bath.

8. The process of claim 7 wherein said water soluble tin salt, said water soluble lead salt or both are contained in an amount of about 0.5 to 30 grams/liter, said acid is contained in an amount of about 50 to 200 grams/liter.

9. The process of claim 7 wherein said complexing agent is thiourea or a derivative thereof.

10. The process of claim 7 wherein the electroless plating bath further comprises a reducing agent.

11. The process of claim 10 wherein said reducing agent is hypophosphorus acid or a water soluble hypophosphite.

12. The process of claim 10 wherein said reducing agent is contained in an amount of about 30 to 300 grams/liter.

13. The process of claim 7 wherein said water soluble copper salt is added to the fresh plating bath in an amount of about 0.01 to 5 grams/liter.

* * * * *